(12) United States Patent
Yang et al.

(10) Patent No.: US 11,043,802 B2
(45) Date of Patent: Jun. 22, 2021

(54) SHUTDOWN APPARATUS FOR PHOTOVOLTAIC MODULE

(71) Applicant: SUNGROW POWER SUPPLY CO., LTD., Anhui (CN)

(72) Inventors: Zongjun Yang, Anhui (CN); Yanfei Yu, Anhui (CN); Hua Ni, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 79 days.

(21) Appl. No.: 16/540,901

(22) Filed: Aug. 14, 2019

(65) Prior Publication Data

US 2020/0091706 A1    Mar. 19, 2020

(30) Foreign Application Priority Data

Sep. 17, 2018  (CN) .......................... 201811082182.6

(51) Int. Cl.
*H02H 7/20* (2006.01)
*H02S 50/00* (2014.01)
(Continued)

(52) U.S. Cl.
CPC .............. *H02H 7/20* (2013.01); *G01R 31/50* (2020.01); *H02S 40/36* (2014.12); *H02S 50/00* (2013.01)

(58) Field of Classification Search
CPC ........ H02H 7/20; H02H 7/1213; G01R 31/50; H02S 40/36; H02S 50/00; Y02E 10/56; H02J 3/383
(Continued)

(56) References Cited

U.S. PATENT DOCUMENTS 8,988,838 B2    3/2015  Har-Shai et al.
9,660,637 B1 *  5/2017  Chuang .................. H03K 17/06
(Continued)

FOREIGN PATENT DOCUMENTS

CA      2895545 A1    12/2015
CN    103227588 A     7/2013
(Continued)

OTHER PUBLICATIONS

UL 1741, "Standard for Safety Inverters, Converters, Controllers and Interconnection System Equipment for Use with Distributed Energy Resources," 2nd Ed., Dec. 22, 2017.
(Continued)

*Primary Examiner* — Dharti H Patel
(74) *Attorney, Agent, or Firm* — Harness, Dickey & Pierce, P.L.C.

(57) ABSTRACT

A shutdown apparatus for a photovoltaic module is provided. Only one first switch is connected in series in an output circuit of the photovoltaic module, and a controller controls the first switch to be switched on in a normal power generation state and controls the first switch to be switched off in a shutdown state. If a short circuit fault occurs in the first switch, the controller controls a second switch connected in parallel with the photovoltaic module to be switched on, thereby causing the output of the photovoltaic module short-circuited and ensuring a reliable shutdown. In addition, the second switch is in the shutdown state when the photovoltaic module normally provides output, and the second switch does not cause losses to the output of the photovoltaic module, such that it is not necessary to select a device with a low impedance.

12 Claims, 6 Drawing Sheets

(51) Int. Cl.
*H02S 40/36* (2014.01)
*G01R 31/50* (2020.01)

(58) Field of Classification Search
USPC .................................................. 361/91.1
See application file for complete search history.

(56) References Cited

U.S. PATENT DOCUMENTS

| | | | |
|---|---|---|---|
| 9,799,779 | B2 | 10/2017 | Krein et al. |
| 9,923,516 | B2 | 3/2018 | Har-Shai et al. |
| 9,995,796 | B1* | 6/2018 | Johnson ............... G01R 31/129 |
| 10,381,977 | B2 | 8/2019 | Har-Shai et al. |
| 2013/0194706 | A1 | 8/2013 | Har-Shai et al. |
| 2014/0354250 | A1* | 12/2014 | Deng ................... H02M 3/157 |
| | | | 323/271 |
| 2015/0171789 | A1 | 6/2015 | Har-Shai et al. |
| 2015/0381111 | A1* | 12/2015 | Nicolescu ............ H02H 1/0015 |
| | | | 361/3 |
| 2016/0329715 | A1 | 11/2016 | Orr et al. |
| 2018/0102736 | A1 | 4/2018 | Har-Shai et al. |
| 2019/0393834 | A1 | 12/2019 | Har-Shai et al. |

FOREIGN PATENT DOCUMENTS

| | | |
|---|---|---|
| CN | 203981841 U | 12/2014 |
| CN | 104597750 A | 5/2015 |
| CN | 104682432 A | 6/2015 |
| CN | 107834977 A | 3/2018 |
| CN | 107968627 A | 4/2018 |
| CN | 207283498 U | 4/2018 |
| CN | 207543063 U | 6/2018 |
| DE | 202011109187 U1 | 3/2013 |

OTHER PUBLICATIONS

Extended European Search Report regarding Application No. 19191231.0 dated Jan. 14, 2020.
First Chinese Office Action regarding Application No. 201811082182.6 dated Jan. 3, 2020. Translation provided by Unitalen Attorneys at Law.

* cited by examiner

SHUTDOWN APPARATUS FOR PHOTOVOLTAIC MODULE

CROSS REFERENCE TO RELATED APPLICATION

The present application claims the priority to Chinese Patent Application No. 201811082182.6, titled "SHUTDOWN APPARATUS FOR PHOTOVOLTAIC MODULE", filed on Sep. 17, 2018 with the Chinese Patent Office, which is incorporated herein by reference in its entirety.

FIELD

The present disclosure relates to the technical field of power electronic, and in particular to a shutdown apparatus for a photovoltaic module.

BACKGROUND

As a renewable energy power generation technology, the photovoltaic power generation technology is widely applied at home and abroad. The photovoltaic array outputs a direct current, and the direct current is converted into an alternating current by an inverter and then transmitted to a power grid. However, as the photovoltaic industry expands continuously, the probability of accidents continuously increases. The photovoltaic array in series connection has a high voltage. In order to improve the safety of the photovoltaic system, a shutdown apparatus is generally added for each photovoltaic module, or a smart junction box with a shutdown function is integrated on the photovoltaic module in the conventional technology.

As shown in FIG. 1, the shutdown circuit in the above apparatuses mainly includes a sampling module, a power supply taking power from the photovoltaic module, a controller, and at least one switch connected in series with the photovoltaic module. In a normal operation state, the controller controls the switch to be switched on, and the photovoltaic module can output electrical energy. When it is required to shut down the apparatus, the controller controls the switch to be switched off, so that the output voltage of the photovoltaic module is 0, thereby realizing the function of safety protection.

Since the shutdown apparatus is a safety protection apparatus, such apparatus is required to be designed to have high reliability, to pass safety assessment for functions, and to meet the requirement for not losing the main function (reliable shutdown) in case of a single failure, according to Safety Regulation (UL1741). For the shutdown circuit shown in FIG. 1, in a case that only one switch Q1 is provided and Q1 fails (such as a short-circuit caused by breakdown), the switch Q1 cannot truly realize the shutdown function for the output of the photovoltaic module even if the controller triggers a shutdown instruction. So, the safety authentication cannot be successfully passed. Therefore, generally, two switches (i.e., Q1 and Q2 in FIG. 1) are provided in the main circuit for control. In a case where one switch is short-circuited, the other switch still can be reliably switched off to ensure function safety.

Though the solution of using two switches in series connection is effective, the system loss increases, that is, doubling the conduction loss of the power generation circuit. In order to avoid the loss, switches with lower impedance may be adopted, which in turn results in an increased cost.

SUMMARY

A shutdown apparatus for a photovoltaic module is provided according to the present disclosure to solve the problems of a large loss and a high cost in the conventional technology.

The technical solutions of the present disclosure are described below.

A shutdown apparatus for a photovoltaic module is provided. The shutdown apparatus is configured to realize an output shutdown function of a connected photovoltaic module. The shutdown apparatus includes: a controller and a combination of execution devices. The combination of execution devices includes: a first switch, a second switch, a first driving unit, a second driving unit, an input voltage detecting module, and an output voltage detecting module.

The first switch is arranged on a positive cable or a negative cable of the photovoltaic module.

The second switch is arranged between the positive cable and the negative cable of the photovoltaic module.

The input voltage detecting module is configured to detect an input voltage of the combination of execution devices.

The output voltage detecting module is configured to detect an output voltage of the combination of execution devices.

The controller is configured to control the first switch to be switched on by the first driving unit in a normal power generation state, and control the first switch to be switched off by the first driving unit in a shutdown state; determine, after controlling the first switch to be switched off, whether a short circuit fault occurs in the first switch based on the input voltage and the output voltage of the combination of execution devices; and control the second switch to be switched on by the second driving unit if a short circuit fault occurs in the first switch.

In an embodiment, for determine whether a short circuit fault occurs in the first switch based on the input voltage and the output voltage of the combination of execution devices, the controller is configured to:

determine whether a voltage difference between the input voltage and the output voltage of the combination of execution devices is within a predetermined range; and determine that a short circuit fault occurs in the first switch if the voltage difference is within the predetermined rang; and determine that no short circuit fault occurs in the first switch if the voltage difference is not within the predetermined range.

In an embodiment, before determining whether a short circuit fault occurs in the first switch based on the input voltage and the output voltage of the combination of execution devices, the controller is further configured to: perform filtering or an average calculation on the input voltage and the output voltage of the combination of execution devices within a predetermined time period.

In an embodiment, the first switch is arranged between the photovoltaic module and the second switch; or the second switch is arranged between the photovoltaic module and the first switch.

In an embodiment, the combination of execution devices further includes a first power supply and a second power supply. The first power supply is configured to supply power to the first driving unit; and the second power supply is configured to supply power to the second driving unit.

In an embodiment, the first power supply is configured to take power from the photovoltaic module. The first power supply is a switching power supply, an isolated power supply, or a linear power supply.

In an embodiment, the second power supply is an energy storage device. The second power supply is configured to take power from the photovoltaic module; or the second power supply is configured to take power from an output terminal of the first power supply.

In an embodiment, the second power supply is a current coupler. A coupling inductor in the current coupler is arranged between the second switch and the negative cable of the photovoltaic module.

In an embodiment, the second power supply is configured to take power from another photovoltaic module.

In an embodiment, the first switch and the second switch are relays or semiconductor switch transistors.

In an embodiment, the number of photovoltaic modules connected to the shutdown apparatus is N, the N photovoltaic modules are connected in series and provide output by the shutdown apparatus, and N is a positive integer greater than 1.

The number of the combination of execution devices is N.

Each of the photovoltaic modules is provided with one combination of execution devices.

The controller is connected to the input voltage detecting module and the output voltage detecting module in each combination of execution devices to receive the input voltage reported by the input voltage detecting module and the output voltage reported by the output voltage detecting module in each combination of execution devices; and the controller is further connected to the first driving unit and the second driving unit in each combination of execution devices to control the first switch and the second switch in each combination of execution devices to be switched off or switched on.

In an embodiment, an input terminal of the second power supply in each combination of execution devices is configured to receive a series voltage of the N photovoltaic modules.

According to the shutdown apparatus for a photovoltaic module provided by the present disclosure, only one first switch is connected in series in an output circuit of the photovoltaic module, and the controller controls the first switch to be switched on in the normal power generation state and controls the first switch to be switched off in the shutdown state. If the short circuit fault occurs in the first switch, the controller controls the second switch connected in parallel with the photovoltaic module to be switched on, thereby causing the output of the photovoltaic module short-circuited and ensuring a reliable shutdown. In addition, the second switch is in the shutdown state when the photovoltaic module normally provide output, the second switch does not cause loss to the output of the photovoltaic module, such that it is not necessary to select a device with a low impedance, thereby solving the problems of a large loss and a high cost in the conventional technology.

BRIEF DESCRIPTION OF THE DRAWINGS

In order to illustrate embodiments of the present disclosure or technical solutions in the conventional technology clearer, the drawings, which are to be used in the description of the embodiments or the conventional technology, are briefly described hereinafter. It is apparent that, the drawings in the following description show only some embodiments of the present disclosure, and other drawings may be obtained by those skilled in the art from the drawings without creative efforts.

DETAILED DESCRIPTION OF THE EMBODIMENTS

Technical solutions in embodiments of the present disclosure are described clearly and completely hereinafter in conjunction with the drawings of the embodiments of the present disclosure. Apparently, the embodiments described herein are only a few rather than all of the embodiments of the present disclosure. Any other embodiments obtained by those skilled in the art based on the embodiments of the present disclosure without any creative efforts fall within the protection scope of the present disclosure.

A shutdown apparatus for a photovoltaic module is provided according to the present disclosure to realize an output shutdown function of a connected photovoltaic module, so as to solve the problems of a large loss and a high cost in the conventional technology.

Figure 2:
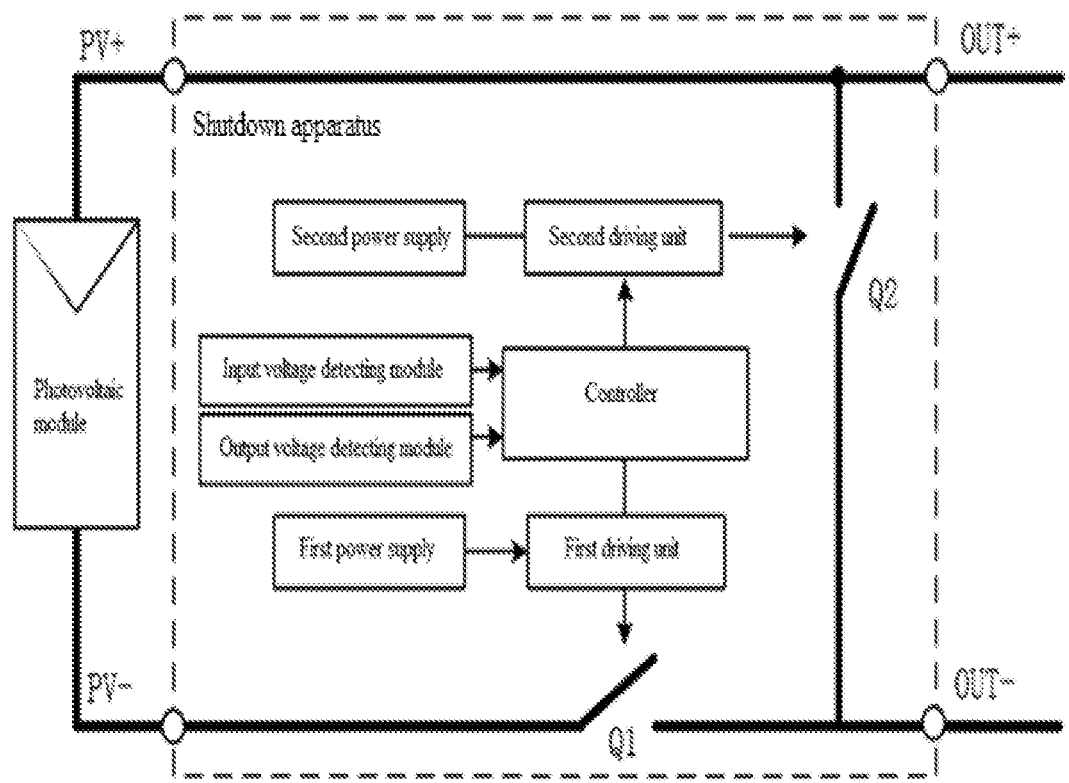
FIG. 2 is a schematic diagram showing a structure of a shutdown apparatus for a photovoltaic module according to an embodiment of the present disclosure.

Referring to FIG. 2, the shutdown apparatus for a photovoltaic module includes a controller and a combination of execution devices. The combination of execution devices includes a first switch Q1, a second switch Q2, a first driving unit, a second driving unit, a first power supply, a second power supply, an input voltage detecting module, and an output voltage detecting module.

The first switch Q1 is arranged on a positive cable or a negative cable of the photovoltaic module.

The second switch Q2 is arranged between the positive cable and the negative cable of the photovoltaic module.

Figure 1:
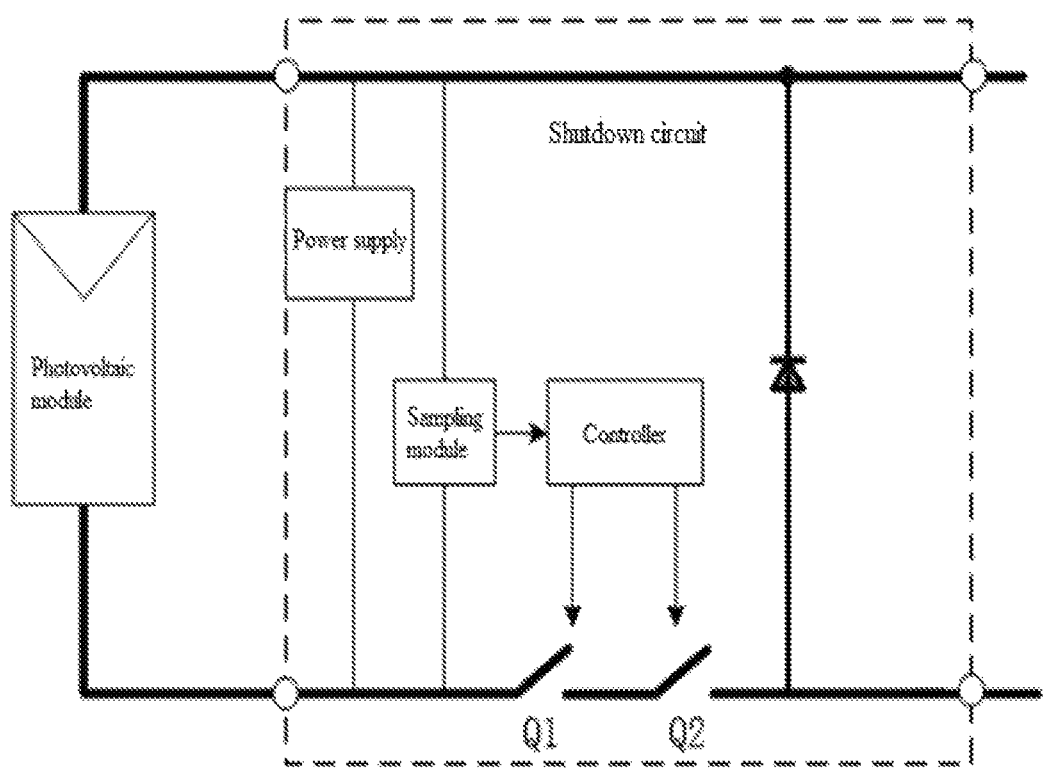
FIG. 1 is a schematic diagram showing a structure of a shutdown circuit of a photovoltaic module according to the conventional technology.

As shown in FIG. 1, the first switch Q1 is arranged on the negative cable between the photovoltaic module and the second switch Q2. In practical applications, the first switch Q1 may be arranged on the positive cable, and the second switch Q2 may be arranged between the photovoltaic module and the first switch Q1. Specific arrangement depends on the application environment and is not limited herein, and various arrangements all fall in the protection scope of the present disclosure.

The first switch Q1 and the second switch Q2 may be relays or semiconductor switch transistors such as MOSFET. In a case that the second switch Q2 is a semiconductor switch transistor, the second switch Q2 can further provide a bypass function for the photovoltaic module. If the semiconductor switch transistor does not include a body diode, the controller further provides a bypass control function. If the semiconductor switch transistor includes a body diode, the controller is not required to provide the corresponding bypass control function.

The first power supply is configured to supply power to the first driving unit.

The second power supply is configured to supply power to the second driving unit.

How the two power supplies taking power is not limited, and may be determined according to the application environment. Various power taking manners fall in the protection scope of the present disclosure.

The input voltage detecting module is configured to detect an input voltage of the combination of execution devices.

The output voltage detecting module is configured to detect an output voltage of the combination of execution devices.

The input voltage of the combination of execution devices refers to an output voltage of the photovoltaic module itself, that is, a voltage between PV+ and PV− in FIG. 2. The output voltage of the combination of execution devices refers to an output voltage of the photovoltaic module after passing through the combination of execution devices, such as a voltage between OUT+ and OUT− in FIG. 2.

The operation principle of the shutdown apparatus is described as follows.

Figure 3:
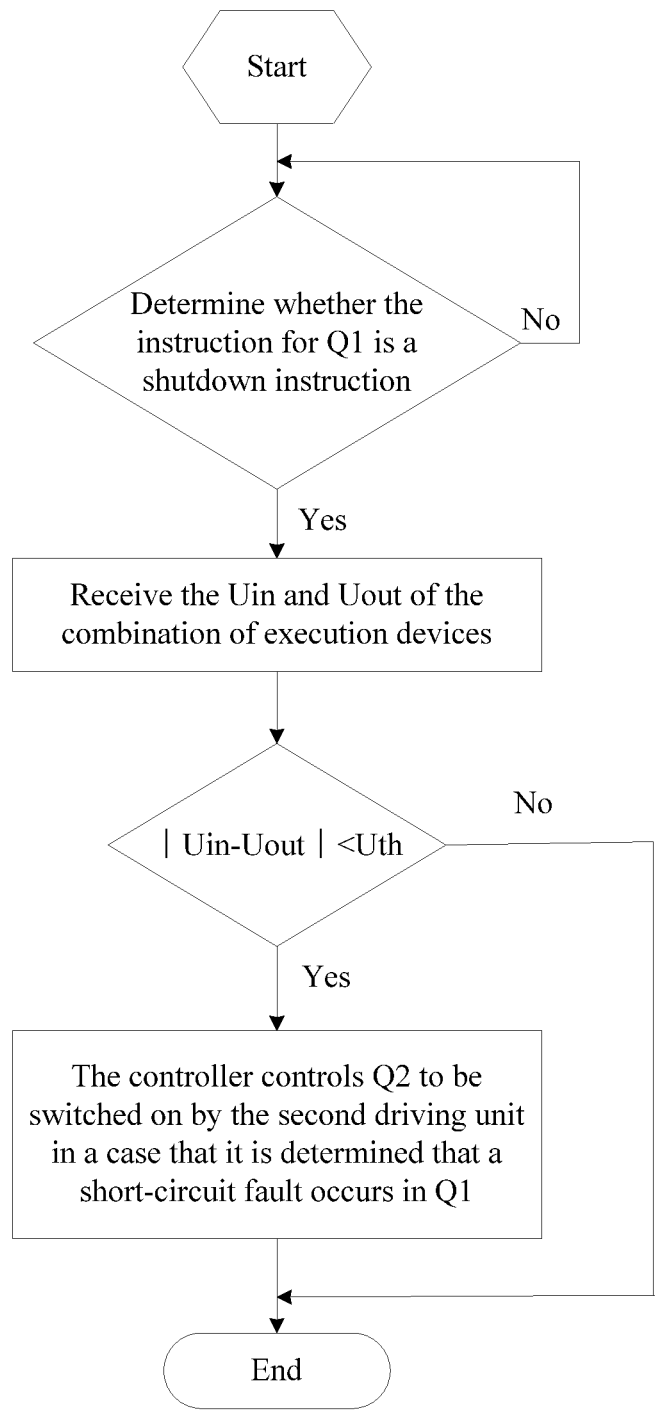
FIG. 3 is a schematic diagram showing a control process of a shutdown apparatus for a photovoltaic module according to an embodiment of the present disclosure.

In a normal power generation state, the first switch Q1 is in an on state, and the second switch Q2 is in a shutdown state. In a shutdown state, the controller sends a shutdown instruction to the first switch Q1, and the instruction controls the first switch Q1 to be switched off by the first driving unit. As shown in FIG. 3, after determining that the instruction for the first switch Q1 is a shutdown instruction, the controller receives an input voltage Uin and an output voltage Uout of the combination of execution devices, and determines, based on the input voltage Uin and the output voltage Uout of the combination of execution devices, whether a voltage difference between the input voltage Uin and the output voltage Uout of the combination of execution devices falls within a predetermined range (for example 0.5V), that is, determining whether |Uin−Uout|<Uth. If the voltage difference falls within the predetermined range, it is indicated that the input and output of the combination of the execution devices are substantially the same, and the reliable shutdown is not realized, and thus it is determined that a short circuit fault occurs in the first switch Q1. If the voltage difference does not fall within the predetermined range, it is determined that no short circuit fault occurs in the first switch Q1. Moreover, if it is determined that the short circuit fault occurs in the first switch Q1, the controller controls the second switch Q2 to be switched on by the second driving unit, so as to cause the output of the photovoltaic module short-circuited, thereby ensuring the reliable shutdown of the photovoltaic module.

Further, when detecting the input voltage and the output voltage for determining, the controller may filter sampling values sampled in a time period, or may continuously sample in a time period and then calculate an average of the values, in order to reduce misdetermination. The manner for obtaining the input voltage and the output voltage is not limited herein and may be determined based on the application environment. Various manners for obtaining the input voltage and the output voltage fall in the protection scope of the present disclosure.

With the shutdown apparatus for a photovoltaic module according to the present embodiment, only one first switch Q1 is connected in series in an output circuit of the photovoltaic module, and the controller controls the first switch Q1 to be switched on in the normal power generation state and controls the first switch Q1 to be switched off in the shutdown state. If the short circuit fault occurs in first switch Q1, the controller can further cause the output of the photovoltaic module short-circuited by controlling the second switch Q2 to be switched on, such that the shutdown apparatus can pass the safety assessment in case of a single failure. In addition, the second switch is in the shutdown state when the photovoltaic module normally provides output, and the second switch does not cause losses to the output of the photovoltaic module, such that it is not necessary to select a device with a low impedance, thereby solving the problems of the large loss and the high cost in the conventional technology.

Figure 4:
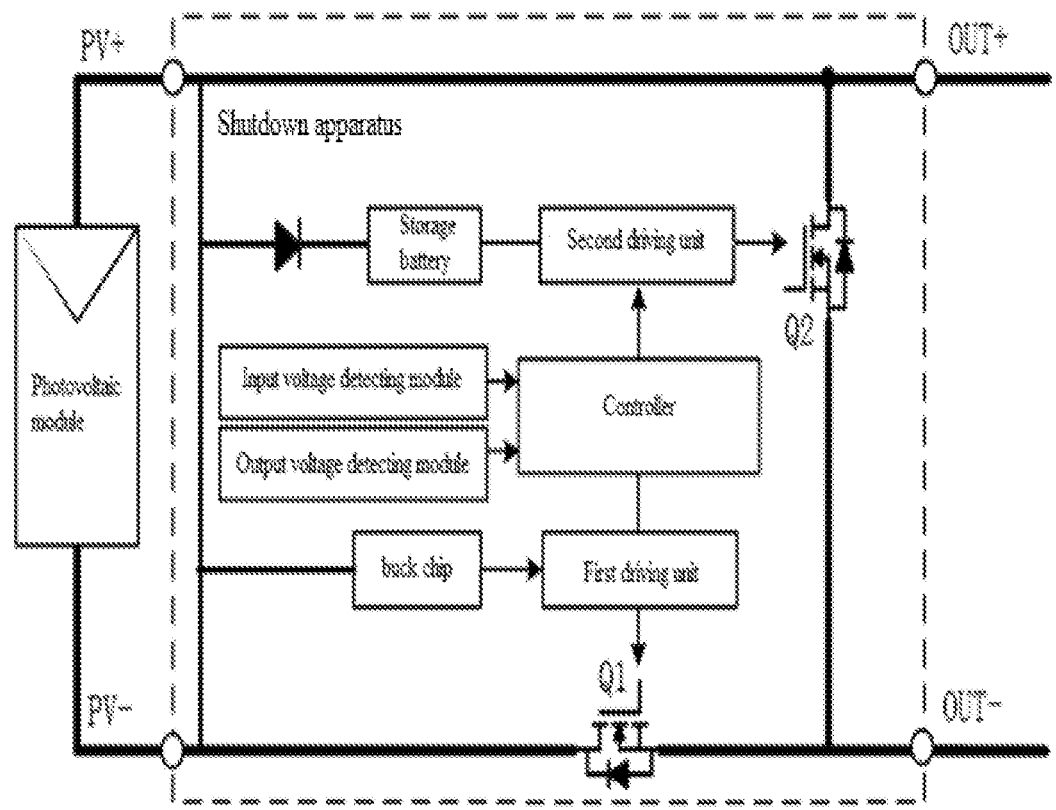
FIG. 4 is a schematic diagram showing a structure of a shutdown apparatus for a photovoltaic module according to another embodiment of the present disclosure.
Figure 5:
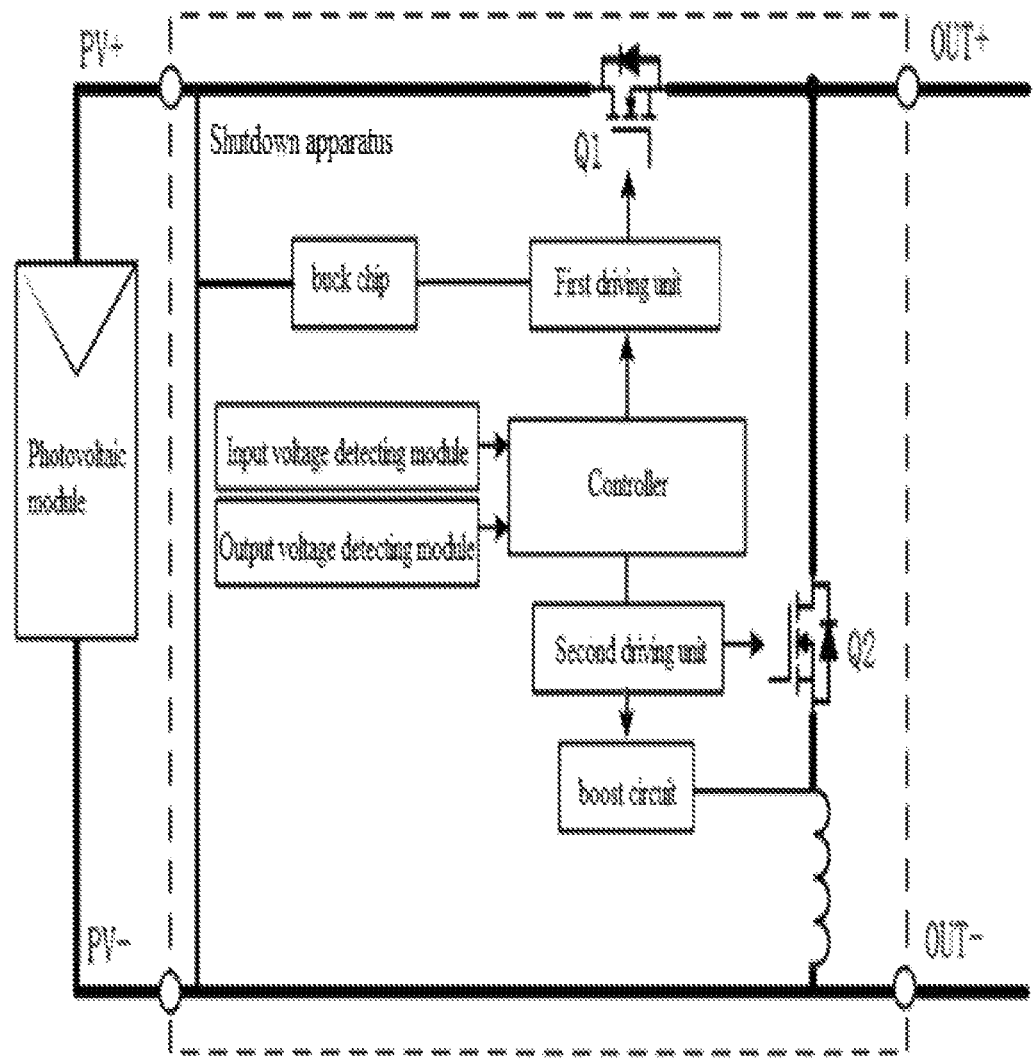
FIG. 5 is a schematic diagram showing a structure of a shutdown apparatus for a photovoltaic module according to yet another embodiment of the present disclosure.

It should be noted that, the shutdown apparatus in practical applications may have various power taking manners and specific arrangement of the two power supplies, based on the above embodiments, FIG. 2 and FIG. 3. For example, the first power supply may take power from a connected photovoltaic module. The first power supply may be a switching power supply, an isolated power supply, or a linear power supply, for example. The first power supply in FIG. 4 and FIG. 5 is a buck chip. The form of the first power supply is not limited herein, and may be determined according to the application environment. Various forms of the first power supply fall in the protection scope of the present disclosure.

Further, if the short circuit fault occurs in the first switch Q1 in the shutdown state, the controller controls the second switch Q2 to be switched on. In this case, since the photovoltaic module is short-circuited by the first switch Q1 and the second switch Q2, the first power supply cannot operate. Therefore, by providing the second power supply with an energy storage function or an additional power supply, it can be ensured that the second switch Q2 is reliably switched on, and the input voltage and the output voltage of the combination of execution devices are limited to 0V, thereby realizing the safe shutdown and high reliability.

In a case that the second power supply is an energy storage device, such as a storage battery (as shown in FIG. 4) or a supercapacitor (not shown), the energy storage device takes power from the photovoltaic module (as shown in FIG. 4) or from an output terminal of the first power supply (not shown) and performs energy storage. If the photovoltaic module is short-circuited, the stored energy can continuously supply a driving voltage to the second switch Q2. In practical applications, a diode may be connected in series with the storage battery to prevent current backflow, as shown in FIG. 4. In addition, in order to prevent the current backflow, the diode may be arranged at a common node from which the two power supplies take power, which is not limited herein.

As shown in FIG. 4, the first switch Q1 is arranged on the negative cable of the photovoltaic module, and the second switch Q2 is arranged on an output side of the combination of execution devices. The first switch Q1 and the second switch Q2 are both MOSFETs, the first power supply is a buck chip, and the second power supply includes the storage battery and the diode. The operation principle of the controller is described as follows.

In the normal power generation state, the controller controls the first switch Q1 to maintain an on state and controls the second switch Q2 to be switched off.

In the shutdown state, the controller switches off the first switch Q1, and determines based on the received input voltage and output voltage. If the first switch Q1 is short-circuited, the voltage difference between the input voltage and the output voltage is lower than 0.5V. In this case, the second switch Q2 is controlled to be switched on to cause the entire photovoltaic module short-circuited, and the output voltage becomes 0.

Since the photovoltaic module is short-circuited, the buck chip cannot operate due to undervoltage. However, since power is supplied to the second driving unit by the storage battery, the controller can still control the second switch Q2 to be switched on. Because the MOSFET is driven by a voltage, a power consumed to maintain an on state of the MOSFET is extremely low, and the apparatus can maintain an operation state for a long time.

When restored to the power generation mode, the controller controls the second switch Q2 to be switched off, and the photovoltaic module charges the storage battery.

The operation principle of the supercapacitor and the operation principle of taking power of the second power supply from the output terminal of the first power supply are the same as those described above, and are not repeated here.

If the second power supply takes power from other source, the second power supply may be a current coupler (as shown in FIG. 5), or the second power supply may take power from another photovoltaic module (not shown), which is not limited herein.

As shown in FIG. 5, the first switch Q1 is arranged on the positive cable of the photovoltaic module, and the second switch Q2 is arranged on an output side of the combination of execution devices. The first switch Q1 and the second switch Q2 are both MOSFETs, the first power supply is the buck chip, and the second power supply is a boost circuit which takes power from a coupling inductor. The operation principle of the controller is described as follows.

If the first switch Q1 is short-circuited at a certain time instant, the controller controls the second switch Q2 to be switched on to cause the entire photovoltaic module short-circuited in the shutdown state. Since a branch where the second switch Q2 is located has the coupling inductor, a voltage for quickly starting the second driving unit is fed back at the short-circuit time instant. After the short-circuit current is stabilized, power is continuously supplied to the second driving unit by a voltage drop generated by an equivalent impedance of the coupling inductor. The control logic is unchanged.

In practical applications, the coupling inductor may be arranged at any position where the current is generated. In an embodiment, the coupling inductor may be arranged between the second switch Q2 and the negative cable of the photovoltaic module, which does not increase the power generation loss.

Other structures and principles are the same as those described in the above embodiments, which are not repeated herein.

Another shutdown apparatus for a photovoltaic module is further provided according to another embodiment of the present disclosure. Based on the above embodiments, the number of photovoltaic modules connected to the shutdown apparatus preferably is N, the N photovoltaic modules are connected in series and provide output by the shutdown apparatus, and N is a positive integer greater than 1.

The number of the combination of execution devices is N.

Each of the photovoltaic modules is provided with one combination of execution devices.

Each combination of execution devices is connected to the controller, reports the respective input voltage and output voltage to the controller, and is controlled by the controller, so that the N photovoltaic modules share one controller and corresponding components, thereby saving a cost.

In the present embodiment, one controller controls the N combinations of execution devices to operate at the same time, and the operation principles of the apparatus are the same as those described in the above embodiments, which are not repeated herein.

Figure 6:
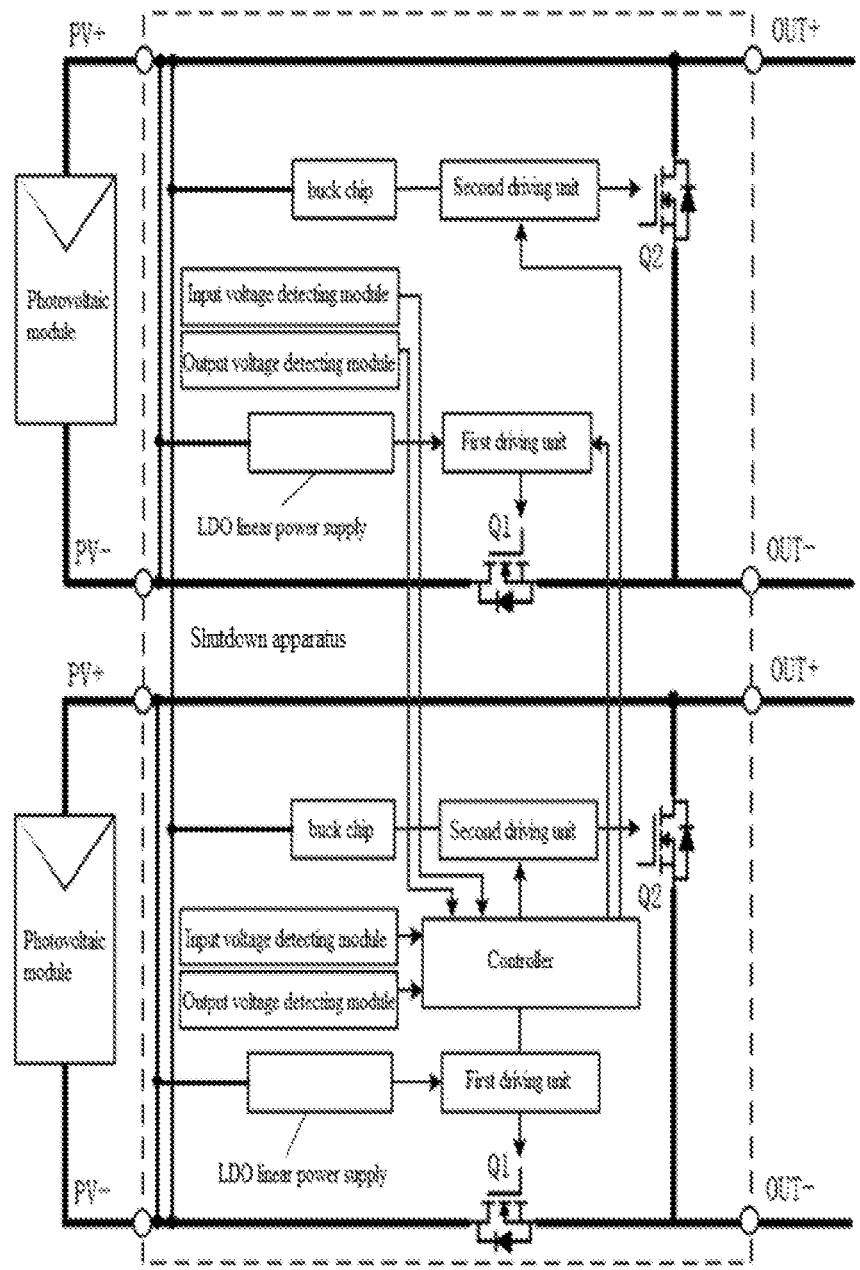
FIG. 6 is a schematic diagram showing a structure of a shutdown apparatus for a photovoltaic module according to yet another embodiment of the present disclosure.

As shown in FIG. 6, N equals to 2, the first switch Q1 in each combination of execution devices is arranged on the negative cable of a corresponding photovoltaic module, and the second switch Q2 is arranged on an output side of the corresponding combination of execution devices. The first switch Q1 and the second switch Q2 are both MOSFETs, the first power supply is an LDO linear power supply, and the second power supply is the buck chip.

The power taking manner of the first power supply may be as described in the last embodiment, for example, the first power supply takes power from the photovoltaic module. The power taking manner of the second power supply may be as described in the last embodiment, or may be the same as the manner shown in FIG. 6, that is, the input terminal of the second power supply in each combination of execution devices receives the series voltage of the N photovoltaic modules.

If a single failure occurs at a certain time instant, for example the first switch Q1 is short-circuited, in this case, the first power supply is powered off but power is still supplied to the second power supply by another photovoltaic module and the second power supply operates, thereby ensuring the normal achievement of the shutdown function.

Besides, the second power supply may take power from another module in addition to the bus, which also falls in the protection scope of the present disclosure.

Other principles of the embodiment are the same as those of the above embodiment, which are not repeated here.

The embodiments of the present disclosure are described in a progressive manner, with an emphasis placed on explaining the difference between each embodiment and other embodiments. The same or similar parts among the embodiments can be referred to each other. For the device disclosed in the embodiments, the corresponding descriptions are relatively simple because the apparatus correspond to the methods disclosed in the embodiments. For the relevant portions, one may be refer to the description of the method parts.

The foregoing embodiments are only preferred embodiments of the present disclosure and are not intended to limit the present disclosure. Preferred embodiments of the present disclosure are disclosed above, which should not be interpreted as limitation to the present disclosure. Numerous alternations, modifications, and equivalents can be made to the technical solution of the present disclosure by those skilled in the art according to the methods and technical content disclosed herein without deviation from the scope of the technical solution of the present disclosure. Therefore, any alternations, equivalents and modifications made to the embodiments above according to the technical essence of the present disclosure without deviation from the content of the technical solution of the present disclosure should fall in the protection scope of the present disclosure.

The invention claimed is:

1. A shutdown apparatus for a photovoltaic module, wherein the shutdown apparatus is configured to realize an output shutdown function of a connected photovoltaic module, and comprises:
    a controller; and
    a combination of execution devices, wherein the combination of execution devices comprises a first switch, a second switch, a first driving unit, a second driving unit, an input voltage detecting unit, and an output voltage detecting unit;

wherein the first switch is arranged on a positive cable or a negative cable of the photovoltaic module;

the second switch is arranged between the positive cable and the negative cable of the photovoltaic module;

the input voltage detecting module is configured to detect an input voltage of the combination of execution devices;

the output voltage detecting module is configured to detect an output voltage of the combination of execution devices; and the controller is configured to control the first switch to be switched on by the first driving unit in a normal power generation state, and control the first switch to be switched off by the first driving unit in a shutdown state; determine, after controlling the first switch to be switched off, whether a short circuit fault occurs in the first switch based on the input voltage and the output voltage of the combination of execution devices; and control the second switch to be switched on by the second driving unit if the short circuit fault occurs in the first switch.

2. The shutdown apparatus for a photovoltaic module according to claim 1, wherein for determining whether a short circuit fault occurs in the first switch based on the input voltage and the output voltage of the combination of execution devices, the controller is configured to:

determine whether a voltage difference between the input voltage and the output voltage of the combination of execution devices is within a predetermined range; and determine that a short circuit fault occurs in the first switch if the voltage difference is within the predetermined range; and determine that no short circuit fault occurs in the first switch if the voltage difference is not within the predetermined range.

3. The shutdown apparatus for a photovoltaic module according to claim 1, wherein before determining whether a short circuit fault occurs in the first switch based on the input voltage and the output voltage of the combination of execution devices, the controller is further configured to:

perform filtering or an average calculation on the input voltage and the output voltage of the combination of execution devices in a predetermined time period.

4. The shutdown apparatus for a photovoltaic module according to claim 1, wherein the first switch is arranged between the photovoltaic module and the second switch; or the second switch is arranged between the photovoltaic module and the first switch.

5. The shutdown apparatus for a photovoltaic module according to claim 4, wherein the combination of execution devices further comprises a first power supply and a second power supply;

the first power supply is configured to supply power to the first driving unit; and the second power supply is configured to supply power to the second driving unit.

6. The shutdown apparatus for a photovoltaic module according to claim 5, wherein the first power supply is configured to take power from the photovoltaic module; and the first power supply is a switching power supply, an isolated power supply, or a linear power supply.

7. The shutdown apparatus for a photovoltaic module according to claim 5, wherein the second power supply is an energy storage device; and the second power supply is configured to take power from the photovoltaic module, or the second power supply is configured to take power from an output terminal of the first power supply.

8. The shutdown apparatus for a photovoltaic module according to claim 5, wherein the second power supply is a current coupler; and a coupling inductor in the current coupler is arranged between the second switch and the negative cable of the photovoltaic module.

9. The shutdown apparatus for a photovoltaic module according to claim 5, wherein the second power supply is configured to take power from another photovoltaic module.

10. The shutdown apparatus for a photovoltaic module according to claim 5, wherein the first switch and the second switch are relays or semiconductor switch transistors.

11. The shutdown apparatus for a photovoltaic module according to claim 5, wherein the number of photovoltaic modules connected to the shutdown apparatus is N, the N photovoltaic modules are connected in series and provide output by the shutdown apparatus, and N is a positive integer greater than 1;

the number of the combination of execution devices is N;

each of the photovoltaic modules is provided with one combination of execution devices;

the controller is connected to the input voltage detecting module and the output voltage detecting module in each combination of execution devices, to receive an input voltage reported by the input voltage detecting module and an output voltage reported by the output voltage detecting module in each combination of execution devices; and the controller is further connected to the first driving unit and the second driving unit in each combination of execution devices, to control the first switch and the second switch in each combination of execution devices to be switched off or switched on.

12. The shutdown apparatus for a photovoltaic module according to claim 11, wherein an input terminal of the second power supply in each combination of execution devices is configured to receive a series voltage of the N photovoltaic modules.

* * * * *